(12) United States Patent
Kim

(10) Patent No.: US 11,676,988 B2
(45) Date of Patent: Jun. 13, 2023

(54) IMAGE SENSOR

(71) Applicant: SK hynix Inc., Icheon-si (KR)

(72) Inventor: Han Jun Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 247 days.

(21) Appl. No.: 16/902,994

(22) Filed: Jun. 16, 2020

(65) Prior Publication Data

US 2021/0143206 A1    May 13, 2021

(30) Foreign Application Priority Data

Nov. 13, 2019 (KR) .......................... 10-2019-0145197

(51) Int. Cl.
 *H01L 27/146* (2006.01)
(52) U.S. Cl.
 CPC .... *H01L 27/14645* (2013.01); *H01L 27/1463* (2013.01); *H01L 27/14621* (2013.01)
(58) Field of Classification Search
 None
 See application file for complete search history.

(56) References Cited

U.S. PATENT DOCUMENTS

| | | | |
|---|---|---|---|
| 2010/0225793 A1* | 9/2010 | Matsuda | H01L 27/14621 |
| | | | 348/294 |
| 2014/0346628 A1* | 11/2014 | Okazaki | H01L 27/14656 |
| | | | 257/432 |
| 2017/0104020 A1* | 4/2017 | Lee | H01L 27/1463 |
| 2017/0170216 A1* | 6/2017 | Lee | H01L 27/14621 |
| 2019/0131327 A1* | 5/2019 | Chou | H01L 27/14629 |
| 2019/0165009 A1* | 5/2019 | Wu | H01L 27/14645 |
| 2020/0243578 A1* | 7/2020 | Pyo | H01L 27/1463 |

FOREIGN PATENT DOCUMENTS

| KR | 10-2016-0017623 A | 2/2016 |
|---|---|---|
| KR | 10-2017-0071184 A | 6/2017 |

* cited by examiner

*Primary Examiner* — Ali Naraghi
(74) *Attorney, Agent, or Firm* — Perkins Coie LLP

(57) ABSTRACT

An image sensor is disclosed. The image sensor includes a first pixel of a first color arranged alternately with a pixel of a second color in a first direction of a pixel array, a second pixel of the first color arranged alternately with a pixel of a third color in the first direction in a row different from that of the first pixel of the first color, an isolation layer formed to surround the first pixel in the pixel array and structured to have a first depth, and an isolation layer formed to surround the second pixel in the pixel array and structured to have a second depth different from the first depth. One of the first and second pixels of the first color, and each of the pixels of the second color and the third color are configured to selectively receive different colors of light, respectively.

18 Claims, 13 Drawing Sheets

IMAGE SENSOR

CROSS-REFERENCE TO RELATED APPLICATION

This patent document claims the priority and benefits of Korean patent application No. 10-2019-0145197, filed on Nov. 13, 2019, the disclosure of which is incorporated herein by reference in its entirety as part of the disclosure of this patent document.

TECHNICAL FIELD

The technology and implementations disclosed in this patent document generally relate to an image sensor having an isolation layer configured to optically isolate a plurality of contiguous or adjacent pixels from one another.

BACKGROUND

An image sensor is a semiconductor device for capturing and converting optical images to electrical signals. With the recent development of computer, automotive, medical, and communication technology, the efforts for developing high-quality, high-performance image sensors continue to meet the demand from various devices such as smartphones, digital cameras, game consoles, Internet of Things (IoT), robots, surveillance cameras, medical micro-cameras, etc.

One very common type of image sensing device is a charge coupled device (CCD), which has dominated the field of image sensors for a long time. Another common type of image sensing device is a complementary metal oxide semiconductor (CMOS) image sensing device. CCD image sensors have advantages over the CMOS image sensor in terms of noise characteristics and image quality. However, CMOS image sensors are now widely used due to certain advantages over the CCD counterparts, including, e.g., higher frame rates and shutter speed. In addition, CMOS image sensors and signal processing circuitry can be integrated into a single chip, making it possible to miniaturize electronic devices while achieving lower power consumption. Furthermore, using the CMOS fabrication technology can result in reduction in the production costs. Such characteristics of CMOS image sensors make these sensors better suited for implementations in mobile devices.

SUMMARY

The embodiments of the disclosed technology, among other features and benefits, relate to an image sensor that can effectively reduce noise in images.

Some embodiments of the disclosed technology relate to an image sensor that can reduce noise in images by minimize the incident angle variation associated with green pixels.

In an embodiment of the disclosed technology, an image sensor may include a first pixel of a first color arranged alternately with a pixel of a second color in a first direction of a pixel array, a second pixel of the first color arranged alternately with a pixel of a third color in the first direction in a row different from that of the first pixel of the first color, an isolation layer formed to surround the first pixel in the pixel array and structured to have a first depth, and an isolation layer formed to surround the second pixel in the pixel array and structured to have a second depth different from the first depth. One of the first and second pixels of the first color, and each of the pixels of the second color and the third color are configured to selectively receive different colors of light, respectively.

In another embodiment of the disclosed technology, an image sensor may include a color filter array including a red color filter, a blue color filter, a green color filter that are arranged in a Bayer pattern, and a substrate in which an isolation layer is formed to surround each of the red color filter, the blue color filter, and the green color filter. An isolation layer surrounding a green color filter adjacent in a first direction to a red color filter contained in the color filter array has a first depth, and an isolation layer surrounding a green color filter adjacent in the first direction to a blue color filter contained in the color filter array has a second depth different from the first depth.

In an embodiment of the disclosed technology, an image sensor may include a first green pixel arranged alternately with a first pixel in a first direction of a pixel array, and a second green pixel arranged alternately with a second pixel in the first direction in a row different from that of the first green pixel. An isolation layer surrounding a first green pixel contained in a peripheral region of the pixel array may have a first depth. An isolation layer surrounding a second green pixel contained in a peripheral region of the pixel array may have a second depth different from the first depth. Any one of the first green pixel and the second green pixel, and each of the first pixel and the second pixel may be configured to receive different colors of light.

In another embodiment of the disclosed technology, an image sensor may include a color filter array including a red color filter, a blue color filter, a green color filter that are arranged in a Bayer pattern, and a substrate in which an isolation layer is formed to surround each of the red color filter, the blue color filter, and the green color filter. An isolation layer surrounding a green color filter adjacent in a first direction to a red color filter contained in a peripheral region of the color filter array may have a first depth. An isolation layer surrounding a green color filter adjacent in a first direction to a blue color filter contained in a peripheral region of the color filter array may have a second depth different from the first depth.

DETAILED DESCRIPTION

This patent document provides implementations and examples of an image sensor that substantially address one or more issues due to limitations and disadvantages of the related art. Some implementations of the disclosed technology relate to minimizing the amount of noise associated with signals generated from green pixels. Some embodiments of the disclosed technology provide image sensors that can reduce noise that can be generated due to light incident angle variations at green pixels arranged in regions located close to the edge regions of the pixel array.

Figure 1:
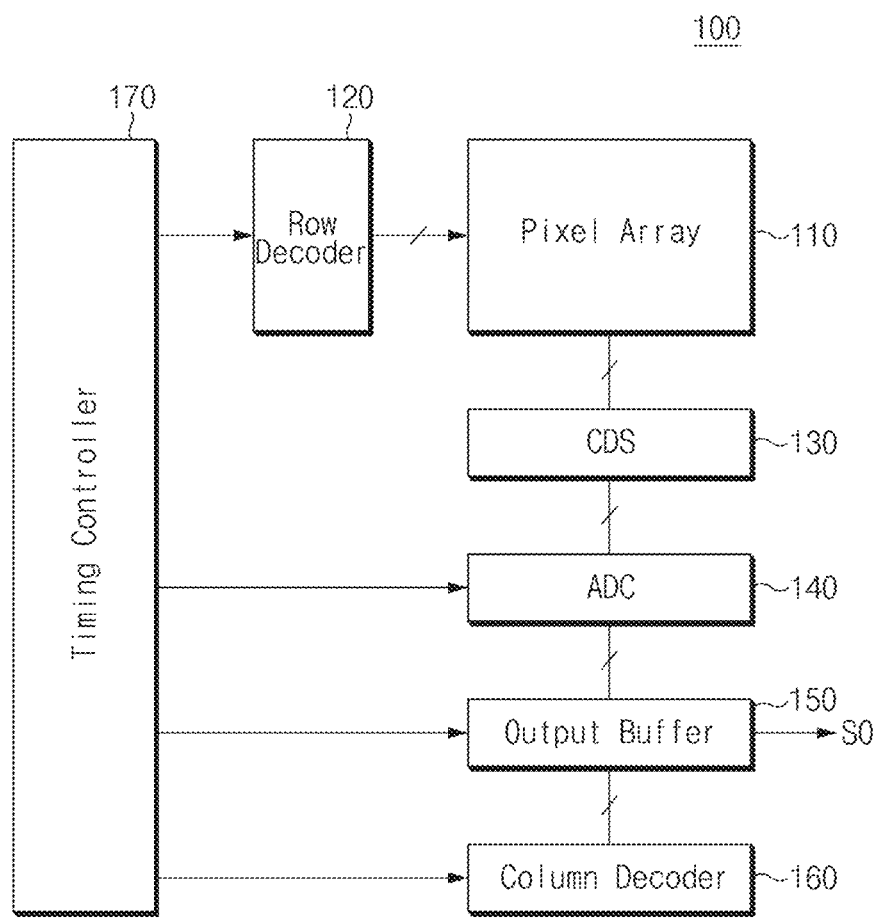
FIG. 1 is a block diagram illustrating an example of an image sensor based on some implementations of the disclosed technology.

FIG. 1 is a block diagram illustrating an example of an image sensor 100 based on some implementations of the disclosed technology.

In some implementations, the image sensor 100 may include a pixel array 110, a row decoder 120, a correlated double sampling (CDS) circuit 130, an analog-to-digital converter (ADC) 140, an output buffer 150, a column decoder 160, and a timing controller 170.

The pixel array 110 may include a plurality of unit pixels arranged in a two-dimensional (2D) shape. The plurality of unit pixels may be implemented such that at least two unit pixels share at least one element, so that the plurality of unit pixels designed in units of a shared pixel structure sharing the at least one element can convert an optical signal or incident light into an electrical signal on a shared pixel basis. The pixel array 110 may receive a drive signal that includes, among others, a row selection signal, a reset control signal, a transmission (Tx) control signal from the row decoder 120, and may operate based on the drive signal received from the row decoder 120.

For example, a 4-transistor (Tr) based unit pixel may include a photodiode, a transfer transistor, a reset transistor, a drive transistor, and a selection transistor.

The photodiode may accumulate photocharges corresponding to the amount of incident light therein. One end of the photodiode may be coupled to receive a source voltage, and the other end of the photodiode may be coupled to a transfer transistor. In some implementations, the source voltage may be a ground voltage. In the context of this patent document, the photodiode may include any type of photoelectric conversion element. In example, the photodiode may be a phototransistor, a photogate, a pinned photodiode or a combination thereof.

The transfer transistor may be coupled in series between the photodiode and the floating diffusion (FD) region. The transfer transistor may be turned on or off in response to a transmission (Tx) control signal. The turned-on transfer transistor may transmit photocharges accumulated in the photodiode to the floating diffusion (FD) region.

The floating diffusion (FD) region may receive photocharges of the photodiode through the transfer transistor, and may accumulate the received photocharges therein. The floating diffusion (FD) region may be modeled as a junction capacitor.

The reset transistor may be coupled between the drain voltage and the floating diffusion (FD) region, and may reset the voltage at the floating diffusion (FD) region to the drain voltage in response to a reset control signal. In some implementations, the drain voltage may be a power-supply voltage (or a power voltage).

The drive transistor may amplify the voltage level of the floating diffusion (FD) region to which photocharges accumulated in the photodiodes have been transmitted, and may transmit the amplified voltage to the selection transistor. In some implementations, the drive transistor may operate as a source follower transistor.

The selection transistor may be used to select at least one pixel when read operations are performed on a row basis. The selection transistor may be turned on by a selection control signal, so that the signal corresponding to the voltage at the floating diffusion (FD) region provided to a drain (i.e., a source of the source follower transistor) of the selection transistor can be output as an output voltage.

The output voltage of the selection transistor may correspond to a reference signal (i.e., a signal corresponding to the reset floating diffusion (FD) region) and an image signal (i.e., a signal corresponding to the floating diffusion (FD) region in which photocharges received from the photodiodes PD are accumulated).

The row decoder 120 may drive the pixel array 110 under control of the timing controller 170. In some implementations, the row decoder may select at least one row from the pixel array 110. The row decoder 120 may generate a row selection signal to select at least one of a plurality of rows. The row decoder 120 may sequentially enable a pixel reset signal for pixels corresponding to at least one selected row, and a transmission (Tx) signal for the pixels. As a result, an analog-type reference signal and an image signal that are generated from each pixel of the selected row may be sequentially transmitted to the CDS circuit 130. In this case, the reference signal and the image signal may be generically called a pixel signal as necessary.

The CDS circuit 130 may sequentially sample and hold the reference signal and the image signal that are transferred from the pixel array 110 to each of the plurality of column lines. That is, the CDS circuit 130 may sample and hold levels of the reference signal and the image signal that correspond to each column of the pixel array 110.

The CDS circuit 130 may transmit a correlated double sampling (CDS) signal corresponding to the reference signal and the image signal for each column to the ADC 140 upon receiving a control signal from the timing controller 170.

In some implementations, the CDS circuit 130 can be used to remove an undesired offset value of pixels by sampling a pixel signal twice to remove the difference between these two samples. For example, the correlated double sampling (CDS) may remove the undesired offset value of pixels by comparing pixel output voltages obtained before and after a light is incident on the pixels so that only pixel output voltages based on the incident light can be measured.

The ADC 140 may be used to convert analog CDS signals to digital signals. The ADC 140 may receive the CDS signal for each column from the CDS circuit 130, may convert the received CDS signal into a digital signal, and may thus output the digital signal. The ADC 140 may generate digital image data based on the CDS signal for each column and a ramp signal received from the timing controller 170.

The ADC 140 may include a plurality of column counters corresponding to respective columns of the pixel array 110, and may convert, using the column counters, the CDS signal for each column into a digital signal, which becomes image data. In another embodiment, the ADC 140 may include a single global counter, and may convert a CDS signal corresponding to each column into a digital signal using a global code received from the global counter.

The output buffer 150 may receive image data for each column from the ADC 140, may capture the received image data, and may output the captured image data. The output buffer 150 may temporarily store image data that is output from the ADC 140 upon receiving a control signal from the timing controller 170. The output buffer 150 may operate as an interface configured to compensate for a difference in transmission (Tx) speed (or in processing speed) between the image sensor 100 and another device coupled to the image sensor 100.

The column decoder 160 may select a column of the output buffer 150 upon receiving a control signal from the timing controller 170, and may sequentially output the image data temporarily stored in the output buffer 150. In some implementations, upon receiving an address signal from the timing controller 170, the column decoder 160 may generate a column selection signal based on the received address signal and select a column of the output buffer 150, such that the column decoder 160 may control image data to be output as an output signal S0 from the selected column of the output buffer 150.

The timing controller 170 may control the row decoder 120, the ADC 140, the output buffer 150, and the column decoder 160.

The timing controller 170 may provide clock signals to internal circuitry of the image sensor 100. The timing controller 170 may also provide a control signal needed for timing control, and address signals needed for selection of a row or column to the row decoder 120, the column decoder 160, the ADC 140, and the output buffer 150. In an embodiment, the timing controller 170 may include a logic control circuit, a phase locked loop (PLL) circuit, a timing control circuit, a communication interface circuit, etc.

Figure 2:
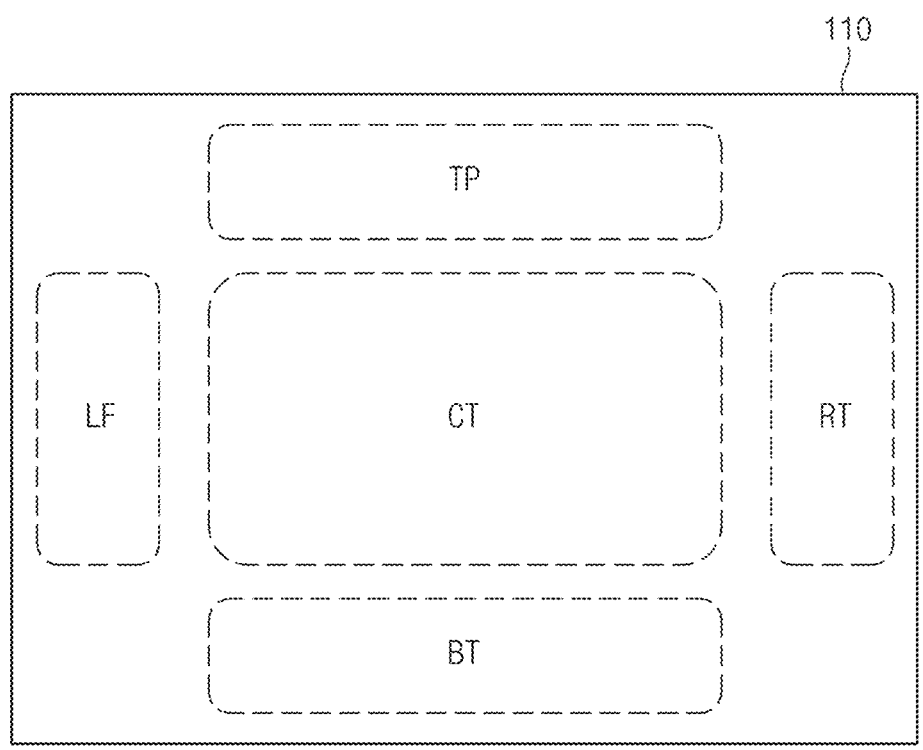
FIG. 2 is a schematic diagram illustrating an example of a pixel array shown in FIG. 1 based on some implementations of the disclosed technology.

FIG. 2 is a schematic diagram illustrating an example of the pixel array shown in FIG. 1 based on some implementations of the disclosed technology.

In some implementations, the pixel array 110 may include a plurality of pixels arranged in a matrix including a plurality of rows and a plurality of columns.

The plurality of pixels may be arranged in a Bayer pattern, and an arbitrary (2×2) pixel array may include a single red pixel (R), a single blue pixel (B), and two green pixels Gr and Gb. The green pixel (Gr) may indicate a green pixel adjacent to the red pixel (R) in a row direction (or in a first direction), and the green pixel (Gb) may indicate a green pixel adjacent to the blue pixel (B) in a row direction (or in a first direction). In other words, in a single row of the pixel array 110, the red pixel (R) and the green pixel (Gr) may be alternately arranged in the row direction. In another row adjacent to the single row, the blue pixel (B) and the green pixel (Gb) may be alternately arranged in the row direction. In an embodiment of the disclosed technology, the green pixel (Gr) may be defined as a first green pixel, and the green pixel (Gb) may be defined as a second green pixel. In addition, the red pixel (R) may be defined as a first pixel, and the blue pixel (B) may be defined as a second pixel. As will be described later, any one of the first green pixel and the second green pixel may receive different colors of light, and the first pixel and the second pixel may receive different colors of light.

In the context of this patent document, the red pixel indicates an imaging pixel that includes a red color filter, the blue pixel indicates an imaging pixel that includes a blue color filter, and the green pixel indicates an imaging pixel that includes a green color filter.

The red pixel (R), the blue pixel (B), and the green pixels Gr and Gb may be classified according to types of color filters contained in each pixel. Each imaging pixels includes an optical filter located above each photoelectric conversion element to filter the light to be detected by the photoelectric conversion element. That is, the color filter contained in the red pixel (R) may be used to filter a wavelength band corresponding to red light, and may enable the filtered light to pass therethrough, such that the intensity of light corresponding to a red color can be sensed. The color filter contained in the blue pixel (B) may let a wavelength band corresponding to a blue color pass therethrough, such that the intensity of light corresponding to the blue light can be sensed by a corresponding photoelectric conversion element. The color filter contained in each of the green pixels Gr and Gb may let a wavelength band corresponding to a green color pass therethrough, such that the intensity of light corresponding to the green light can be sensed by a corresponding photoelectric conversion element. Imaging pixels in the pixel array 110 are classified according to types of the color filters contained in the respective pixels, and thus each photoelectric conversion element has a color filter thereon. Therefore, it can be said that an arrangement of pixels in the pixel array 110 matches an arrangement of color filters in the color filter array (CFA).

In some implementations, the pixel array 110 may be divided into different regions, including a center region (CT), a left region (LF) located at a first side (this will be referred to as "left side" or "left region" for convenience) of the center region (CT), a right region (RT) located at a second side (an opposing side to the first side; this will be referred to as "right side" or "right region" for convenience) of the center region (CT), a top region (TP) located at a third side, e.g., above the center region (CT), and a bottom region (BT) located at a fourth side, e.g., below the center region (CT). In other words, the left region (LF), the right region (RT), the top region (TP), and the bottom region (BT) may be classified according to their relative positions with respect to the center region (CT).

The numbers of rows and columns contained in each of the center region (CT), the left region (LF), the right region (RT), the top region (TP), and the bottom region (BT) may vary depending on the required specification for the image sensor device, and the plurality of regions adjacent to each other may be consecutively arranged or may be spaced apart from each other by a predetermined distance as necessary. In one example, each of the left region (LF), the right region (RT), the top region (TP), and the bottom region (BT) may be divided into a plurality of sub-regions.

In operating an image sensor that includes the pixel array 110, light incident on imaging pixels passes through a lens module (not shown) including at least one lens arranged centering upon an optical axis, and then the light reaches the pixel array 110 to convert the intensity of incident light into an electrical signal. In this case, since the center region (CT), the left region (LF), the right region (RT), the top region (TP), and the bottom region (BT) are situated in different locations, incidence angles of chief rays (also called key light rays) to be directed to different regions (CT, LF, RT, TP, BT) may vary. Given the optical axis may be located at the center point of the pixel array 110, the pixel array 110 is spaced by a predetermined distance from the lens module (not shown), and the chief ray may travel toward each region of the pixel array 110 from a point at which the lens module (not shown) and the optical axis intersect. Therefore, the chief ray for the left region (LF) may enter the left region (LF) in the left direction from the center point of the pixel array 110, the chief ray for the right region (RT) may enter the right region (RT) in the right direction from the center point of the pixel array 110, the chief ray for the top region (TP) may enter the top region (TP) in an upward direction from the center point of the pixel array 110, and the chief ray for the bottom region (BT) may enter the bottom region (BT) in a downward direction from the center point of the pixel array 110.

Figure 3:
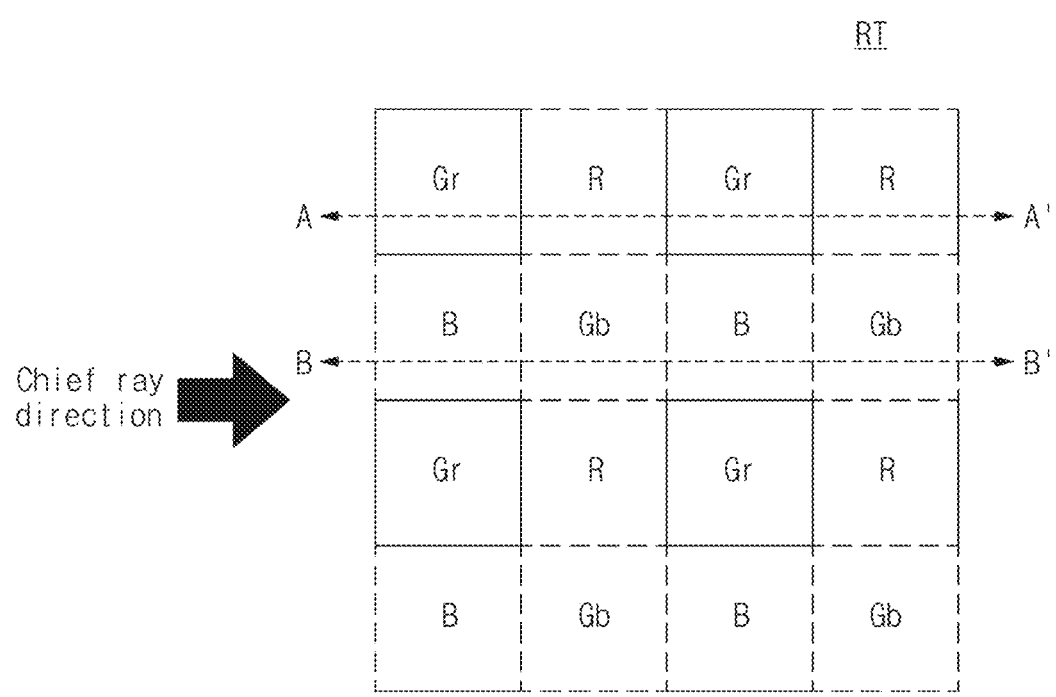
FIG. 3 is a schematic diagram illustrating an example of a right region (RT) shown in FIG. 2 based on some implementations of the disclosed technology.

FIG. 3 is a schematic diagram illustrating an example of the right region (RT) shown in FIG. 2 based on some implementations of the disclosed technology.

In some implementations, the right region (RT) may include pixels arranged in a (4×4) matrix, and the pixels may be arranged in a Bayer pattern. The pixels arranged in the (4×4) matrix are disclosed in FIG. 3 for convenience of description, the arrangement of pixels in the matrix may vary depending on various embodiments.

As described above, the chief ray for the right region (RT) may be arranged in a direction from the center point of the pixel array 110 to the right side of the pixel array 110. In this case, the depth of an isolation layer (e.g., 232 of FIG. 5) surrounding the green pixel (Gr) may be set to a first depth greater than a reference depth. In addition, the depth of an isolation layer (e.g., 234 of FIG. 7) surrounding the green pixel (Gb) may be set to a second depth less than the reference depth.

Although the following examples shown in FIGS. 3 to 7 will be disclosed centering upon the right region (RT), in some implementations, the same or similar structures can also be applied to the left region (LF).

In FIG. 3, the isolation layer corresponding to the first depth is indicated by solid lines, and the other isolation layer corresponding to the second depth is indicated by dotted lines.

Figure 4:
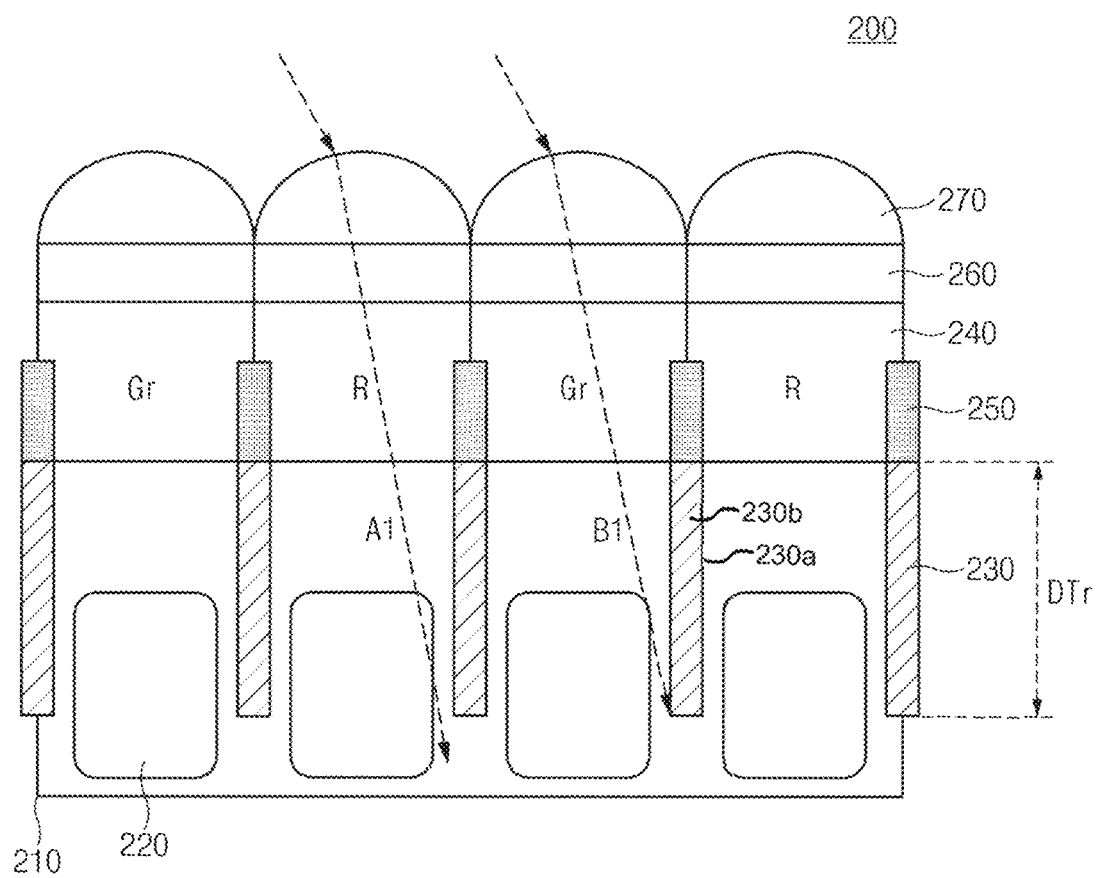
FIG. 4 is a cross-sectional view illustrating a comparison example of the right region (RT) taken along a first cutting line shown in FIG. 3 based on some implementations of the disclosed technology.

FIG. 4 is a cross-sectional view illustrating a comparison example of the right region (RT) taken along a first cutting line A-A' shown in FIG. 3 based on some implementations of the disclosed technology.

Assuming that the depth of the isolation layer contained in the right region (RT) is set to a reference depth (DTr), the cross-sectional view 200 taken along the first cutting line A-A' is shown in FIG. 4.

Referring to FIG. 4, the cross-sectional view 200 may include a substrate 210, at least one photodiode 220, at least one isolation layer 230, at least one grid 250, at least one over-coating layer 260, and at least one microlens 270.

The substrate 210 may be a silicon substrate, and may include at least one photodiode 220 and at least one isolation layer 230. The substrate 210 may be a P-type substrate doped with P-type ions. The bottom surface of the substrate 210 may be defined as a front side, and the top surface of the substrate 210 may be defined as a back side. Therefore, each pixel may include a back side illumination (BSI) structure designed to receive incident light through a back side of the substrate 210.

The photodiode 220 may be formed as an N-type doped region through ion implantation of N-type ions. In one embodiment, the photodiode 220 may be formed by stacking a plurality of doped regions. In this case, a lower doped region may be formed by implantation of $N^+$ ions, and an upper doped region may be formed by implantation of $N^-$ ions. The photodiode 220 may be arranged across as large a region as possible to increase a fill factor indicating light reception (Rx) efficiency.

The isolation layer 230 may be formed to surround a peripheral region of each pixel when viewed in a plane. In an example, the isolation layer 230 may be formed by etching in a vertical direction from the back side of the substrate 210 by a predetermined depth, and this process can be performed using a deep trench isolation (DTI) process. The isolation layer 230 can be used to electrically or optically isolate each of contiguous pixels located adjacent to each other. Since the isolation layer 230 is formed through the DTI process about the back side of the substrate 210, the isolation layer 230 may be defined as a backside DTI (BDTI).

In some implementations, the isolation layer 230 may include a sidewall 230a and an inner layer 230b. In some implementations, the sidewall 230a may be formed outside the inner layer 230b or may surround the inner layer 230b. In some implementations, the inner layer 230b may include an electrode connected to an interconnect in the image sensor.

The sidewall 230a may be formed of an insulation material that is different in refractive index from the substrate 210. That is, the sidewall 230a may be formed of an insulation material having a high reflection rate in a different way from the substrate 210. In some implementations, the sidewall 230a may be formed of at least one selected from the group of a silicon oxide film, a silicon nitride film, and a silicon oxynitride film. The sidewall 230a may be used to avoid a potential optical crosstalk that may result in a decrease in signal-to-noise ratio (SNR) by light rays that enter a pixel and accidentally travel toward another pixel near that pixel.

The inner layer 230b may be formed of a conductive material that fills a trench region of the isolation layer 230 in an inner region of the sidewall 230a. In some implementations, the inner layer 230b may be formed of polysilicon or doped polysilicon doped with impurities. In one embodiment of the disclosed technology, the inner layer 230b may receive a negative (−) bias voltage from external circuitry (e.g., the row decoder 120). As the negative bias voltage is applied to the inner layer 230b, electrons in the inner layer 230b may move to a position closer to the sidewall 230a. As a result, holes in the substrate 210 may flow to an interface between the sidewall 230a and the substrate 210, so that the resultant holes can be accumulated and fixed. As described above, holes in the substrate 210 that are accumulated and fixed at the interface between the sidewall 230a and the substrate 210 can suppress unwanted electron flow (i.e., a dark current) generated at the surface of the substrate 210 by the DTI process.

The depth of the isolation layer 230 may be set to a reference depth (DTr) shown in FIG. 4. The reference depth (DTr) may indicate the depth of the isolation layer 230 that is formed in the center region (CT) in which incident light is directed vertically and not slanted. That is, the reference depth (DTr) may indicate a predetermined depth by which noise resistance characteristics associated with crosstalk, a dark current, or any other unwanted noise of the pixel signal can be optimized in the center region (CT) in which the chief ray is incident in the same or similar direction to the optical axis direction.

The color filter 240 may be formed over the substrate 210, and may enable light having a specific wavelength (e.g., red light, green light, blue light, etc.) to selectively pass therethrough. In an embodiment, an anti-reflection layer (not shown) may be formed below the color filter 240.

The grid 250 may be formed between the color filters 240 contiguous (or adjacent) to each other to prevent optical crosstalk between the contiguous color filters 240. In some implementations, the grid 250 may be formed of a metal material (e.g., tungsten) having a high light absorption rate.

The over-coating layer 260 may be disposed over the color filter 240 and the grid 250, and may prevent diffused reflection of incident light received from the outside, thereby suppressing flare characteristics. In addition, the over-coating layer 260 may compensate for a step difference between the color filter 240 and the grid 250, so that the over-coating layer 260 may allow the microlens 270 to have a constant height.

The microlens 270 may be formed over the over-coating layer 260, and may increase light gathering power of incident light, resulting in increased light reception (Rx) efficiency.

Referring to FIG. 4, since the isolation layer 230 having the reference depth (DTr) is spaced apart from the front side of the substrate 210 by a certain distance, optical crosstalk may occur between the contiguous pixels in a lower region of the isolation layer 230.

Light leakage to adjacent pixels may cause unwanted noise. For example, light leakage (A1) indicates a light beam that has passed through the red color filter 240 of the red pixel (R) but has not been absorbed into the photodiode 220 of the red pixel (R). The light leakage (A1) may pass through the lower portion of the isolation layer 230 and be absorbed into the photodiode 220 of the green pixel (Gr).

In addition, light leakage (B1) indicates a light beam that has passed through the green color filter 240 of the green pixel (Gr) but has not been absorbed into the photodiode 220 of the green pixel (Gr). The light leakage (B1) may pass through the lower portion of the isolation layer 230 and be absorbed into the photodiode 220 of the red pixel (R).

The light leakage (A1) may be light having a wavelength corresponding to a red color and the light leakage (B1) may be light having a wavelength corresponding to a green color. Therefore, the light leakage (A1) may reach deeper than the light leakage (B1) as shown in FIG. 4.

Since the chief ray is slanted in the right direction, each of the light leakages A1 and B1 affecting the green pixel (Gr) may be considered an optical or light component that travels from the red pixel (R) or to the red pixel (R).

Figure 5:
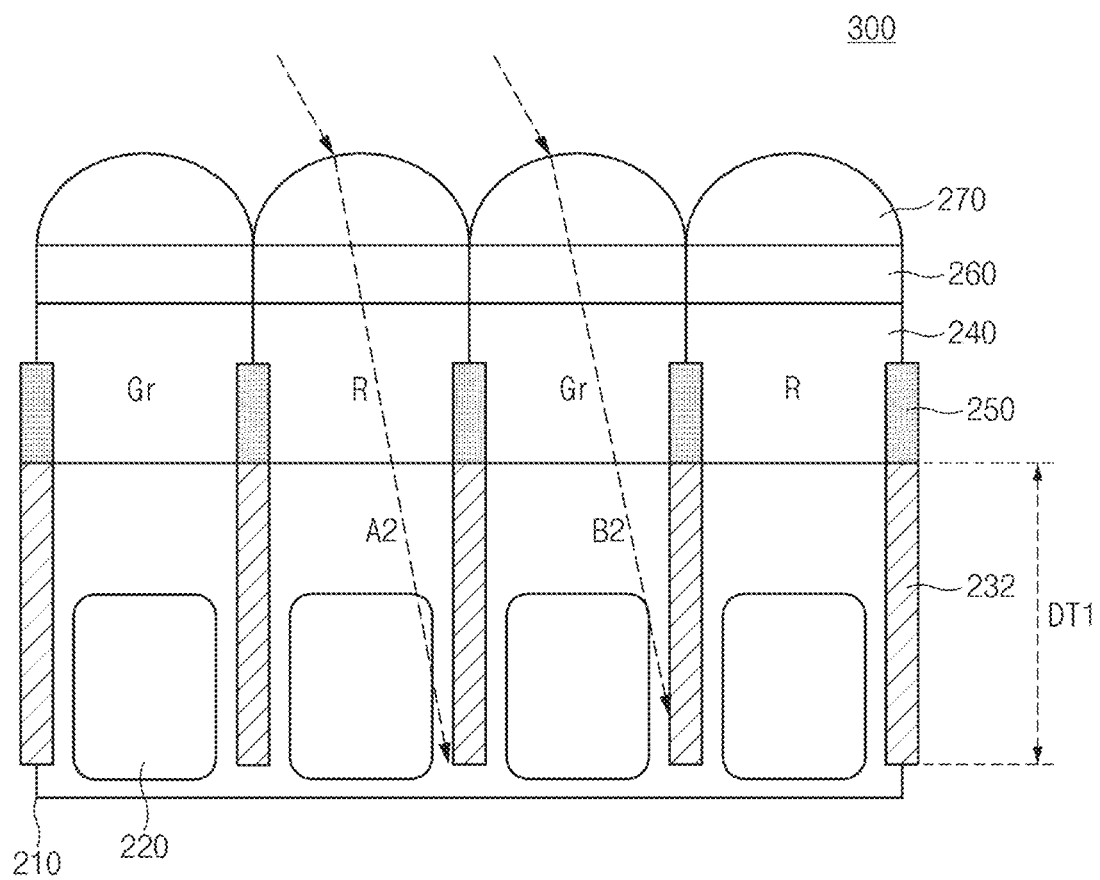
FIG. 5 is a cross-sectional view illustrating one example of the right region (RT) taken along the first cutting line shown in FIG. 3 based on some implementations of the disclosed technology.

FIG. 5 is a cross-sectional view illustrating one example of the right region (RT) taken along the first cutting line A-A' shown in FIG. 3 based on some implementations of the disclosed technology.

Referring to FIGS. 4 and 5, assuming that the depth of the isolation layer surrounding the green pixel (Gr) contained in the right region (RT) shown in FIG. 3 is set to a first depth (DT1), the cross-sectional view 300 taken along the first cutting line A-A' is shown in FIG. 5.

The cross-sectional view 300 may include a substrate 210, at least one photodiode 220, at least one isolation layer 232, at least one color filter 240, at least one grid 250, at least one over-coating layer 260, and at least one microlens 270.

The remaining components shown in FIG. 5 other than the depth of the isolation layer 232 may be identical or similar to the cross-sectional view 200 shown in FIG. 4.

The first depth (DT1) of the isolation layer 232 shown in FIG. 5 may be greater than the reference depth (DTr) of the isolation layer 230 shown in FIG. 4.

As the depth of the isolation layer 232 designed to prevent optical crosstalk gradually increases, light leakage (A2) and light leakage (B2) shown in FIG. 5 may become respectively less than light leakage (A1) and light leakage (B1) shown in FIG. 4. In addition, a reduction in the light leakage (A1) having a wavelength corresponding to red light and capable of reaching deeper than the light leakage (B1) may be larger than a reduction in the light leakage (B1) having a wavelength corresponding to green light.

Therefore, as can be seen from the cross-sectional view shown in FIG. 5 as compared to the cross-sectional view shown in FIG. 4, a change (or variation) in light leakage affecting the pixel signal of the green pixel (Gr) can be expressed as below:

$$\text{Change in Light Leakage about Green Pixel } (Gr) = (A2-A1)-(B2-B1) \quad \text{(Equation 1)}$$

Since the pixel signal of the green pixel (Gr) is proportional to the intensity of light absorbed into the photodiode 220, the pixel signal of the green pixel (Gr) may have a signal change component corresponding to a light leakage change component about the green pixel (Gr).

Since the reduction (A1−A2) in the light leakage (A1) is larger than the reduction (B1−B2) in the light leakage (B1), each of the change in light leakage about the green pixel (Gr) and the signal change component about the green pixel (Gr) may be denoted by a negative (−) number.

Figure 6:
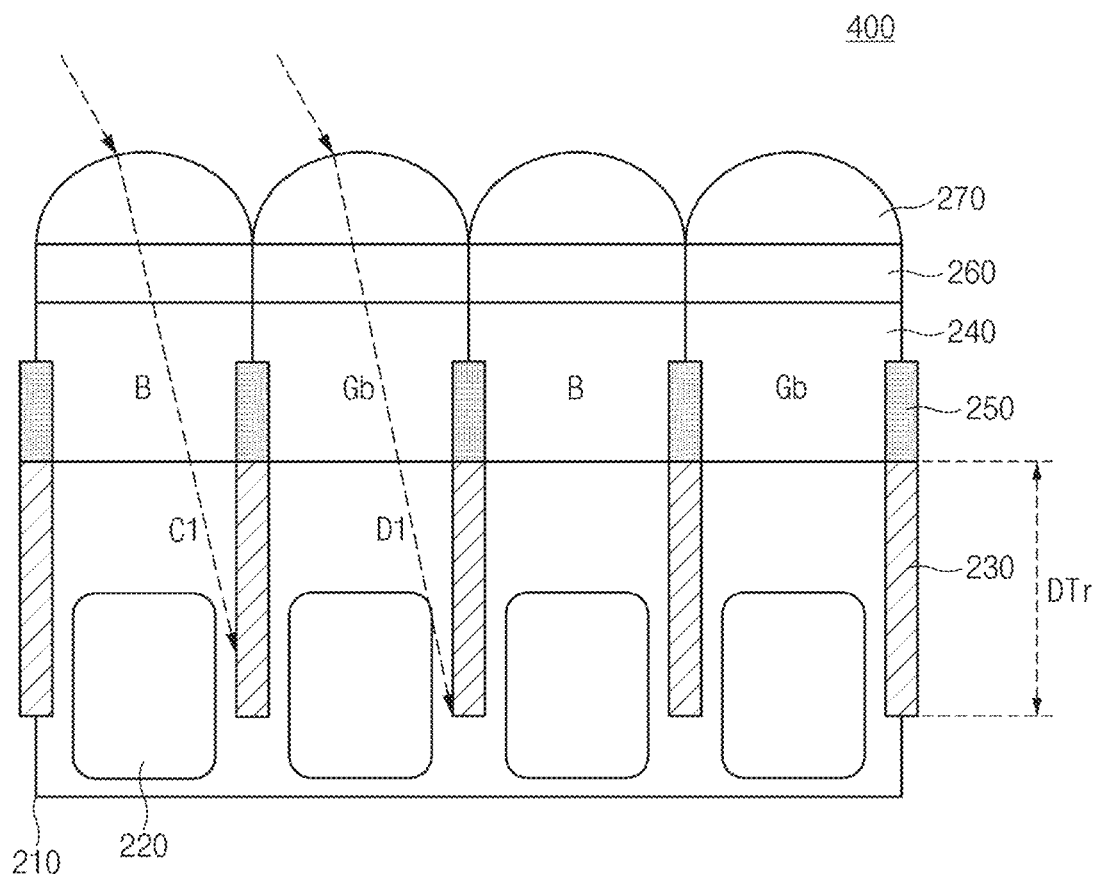
FIG. 6 is a cross-sectional view illustrating a comparison example of the right region (RT) taken along a second cutting line shown in FIG. 3 based on some implementations of the disclosed technology.

FIG. 6 is a cross-sectional view illustrating a comparison example of the right region (RT) taken along the second cutting line B-B' shown in FIG. 3 based on some implementations of the disclosed technology.

Referring to FIGS. 4 and 6, assuming that the depth of the isolation layer contained in the right region (RT) shown in FIG. 3 is set to the reference depth (DTr), the cross-sectional view 400 taken along the second cutting line B-B' is shown in FIG. 6.

The cross-sectional view 400 may include a substrate 210, at least one photodiode 220, at least one isolation layer 230, at least one color filter 240, at least one grid 250, at least one over-coating layer 260, and at least one microlens 270.

The remaining components shown in FIG. 6 other than types of the color filters 240 are substantially identical in structure and material to the cross-sectional view 200 shown in FIG. 4, and as such redundant matters will herein be omitted for brevity.

Referring to FIG. 6, since the isolation layer 230 having the reference depth (DTr) is spaced apart from the front side of the substrate 210 by a predetermined distance, optical crosstalk may occur between the contiguous pixels in a lower region of the isolation layer 230.

Light leakage (C1) indicates a light beam that has passed through the blue color filter 240 of the blue pixel (B) but has not been absorbed into the photodiode 220 of the blue pixel (B). The light leakage (C1) may pass through the lower portion of the isolation layer 230 and be absorbed into the photodiode 220 of the green pixel (Gb).

In addition, light leakage (D1) indicates a light beam that has passed through the green color filter 240 of the green pixel (Gb) but has not been absorbed into the photodiode 220 of the green pixel (Gb). The light leakage (D1) may pass through the lower portion of the isolation layer 230 and be absorbed into the photodiode 220 of the blue pixel (B).

The light leakage (C1) may be light having a wavelength corresponding to blue light and the light leakage (D1) may be light having a wavelength corresponding to green light. Therefore, the light leakage (D1) may reach deeper than the light leakage (C1) having the same incident angle as shown in FIG. 6.

Since the chief ray is slanted in the right direction, each of the light leakages C1 and D1 affecting the green pixel (Gb) may be considered an optical or light component that travels from the blue pixel (B) or to the blue pixel (B).

Figure 7:
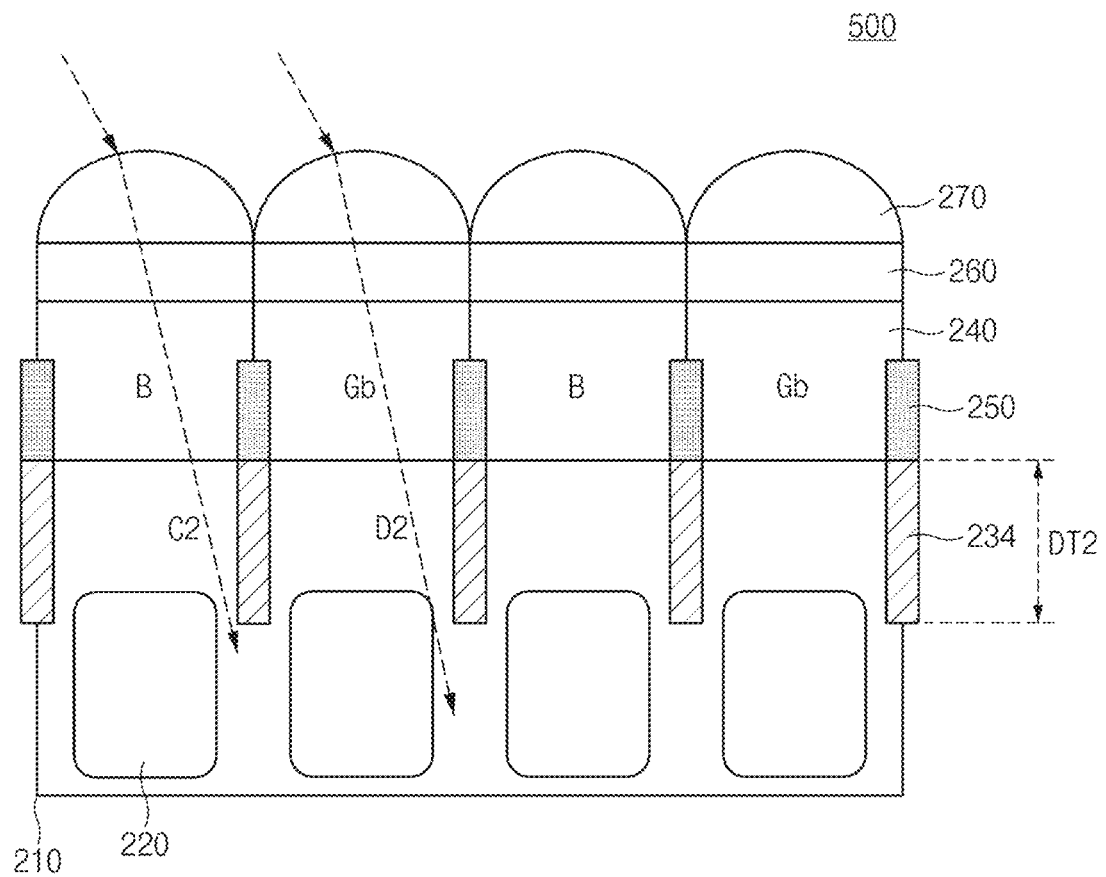
FIG. 7 is a cross-sectional view illustrating one example of the right region (RT) taken along the second cutting line shown in FIG. 3 based on some implementations of the disclosed technology.

FIG. 7 is a cross-sectional view illustrating one example of the right region (RT) taken along the second cutting line B-B' shown in FIG. 3 based on some implementations of the disclosed technology.

Referring to FIGS. 4, 6 and 7, assuming that the depth of the isolation layer surrounding the green pixel (Gb) contained in the right region (RT) shown in FIG. 3 is set to a second depth (DT2), the cross-sectional view 500 taken along the second cutting line B-B' is shown in FIG. 7.

The cross-sectional view 500 may include a substrate 210, at least one photodiode 220, at least one isolation layer 234, at least one color filter 240, at least one grid 250, at least one over-coating layer 260, and at least one microlens 270.

The remaining components shown in FIG. 7 other than the depth of the isolation layer 234 and the type of the color filter 240 may be identical or similar to the cross-sectional view 200 shown in FIG. 4.

The second depth (DT2) of the isolation layer 234 shown in FIG. 7 may be smaller than the reference depth (DTr) of the isolation layer 230 shown in FIG. 6.

As the depth of the isolation layer 234 designed to prevent optical crosstalk gradually decreases, light leakage (C2) and light leakage (D2) shown in FIG. 7 may become respectively larger than light leakage (C1) and light leakage (D1) shown in FIG. 6. In addition, an increase in the light leakage (D2) having a wavelength corresponding to green light and capable of reaching deeper than the light leakage (C2) may be larger than an increase in the light leakage (C2) having a wavelength corresponding to blue light.

Therefore, as can be seen from the cross-sectional view shown in FIG. 7 as compared to the cross-sectional view shown in FIG. 6, a change (or variation) in light leakage affecting the pixel signal of the green pixel (Gb) can be expressed as below:

Change in Light Leakage about Green Pixel (Gb)=
(C2−C1)−(D2−D1)           (Equation 2)

Since the pixel signal of the green pixel (Gb) is proportional to the intensity of light absorbed into the photodiode 220, the pixel signal of the green pixel (Gb) may have a signal change component corresponding to a light leakage change component about the green pixel (Gb).

Since the increase (D2−D1) in the light leakage (D1) is larger than the increase (C2−C1) in the light leakage (C1), each of the change in light leakage about the green pixel (Gb) and the signal change component about the green pixel (Gb) may be denoted by a negative (−) number.

Referring to FIGS. 5 and 7, in the right region (RT) of the pixel array 110, the depth of the isolation layer 232 surrounding the green pixel (Gr) increases such that the signal change component of the green pixel (Gr) can be adjusted to be a negative (−) number. In addition, the depth of the isolation layer 234 surrounding the green pixel (Gb) decreases such that the signal change component of the green pixel (Gb) can be adjusted to be a negative (−) number.

The GG ratio (or GG difference) serving as one of indices representing performance or throughput of the image sensor 100 can be represented by the following equation 3.

$$GG \text{ ratio} = (Gr_{sig} - Gb_{sig})/((Gr_{sig} + Gb_{sig})/2)$$ (Equation 3)

In Equation 3, $Gr_{sig}$ may denote a pixel signal of the green pixel (Gr), which is a green pixel next to a red pixel, and $Gb_{sig}$ may denote a pixel signal of the green pixel (Gb), which is a green pixel next to a blue pixel and adjacent to the green pixel (Gr). As the value of $Gr_{sig}$ gradually increases, it is expected that the amount of noise from the green pixel (Gr) will increase. As the value of $Gb_{sig}$ gradually increases, it is expected that the amount of noise from the green pixel (Gb) will increase. In the right region (RT) and the left region (LF) of the pixel array 110, light transferred from the red pixel (R) to the green pixel (Gr) may have higher intensity (or higher priority), such that the GG ratio is generally denoted by a positive (+) number.

If a deviation (or difference) between the GG ratio and the ideal value is considered high, the depth of the isolation layer 232 surrounding the green pixel (Gr) increases such that the signal change component ($\Delta Gr_{sig}$) of the green pixel (Gr) is adjusted to be a negative (−) number. In addition, the depth of the isolation layer 234 surrounding the green pixel (Gb) decreases such that the signal change component ($\Delta Gb_{sig}$) of the green pixel (Gb) is adjusted to be a negative (−) number. Here, the absolute value of the signal change component ($\Delta Gr_{sig}$) of the green pixel (Gr) may be adjusted to be higher than the absolute value of the signal change component ($\Delta Gb_{sig}$) of the green pixel (Gb). For example, the absolute value of the signal change component ($\Delta Gr_{sig}$) of the green pixel (Gr) may be associated with a difference between the first depth (DT1) and the reference depth (DTr), and the absolute value of the signal change component ($\Delta Gb_{sig}$) of the green pixel (Gb) may be associated with a difference between the second depth (DT2) and the reference depth (DTr), such that the first depth (DT1) and the second depth (DT2) can be experimentally determined in a manner that the absolute value of the signal change component ($\Delta Gr_{sig}$) of the green pixel (Gr) is higher than the absolute value of the signal change component ($\Delta Gb_{sig}$) of the green pixel (Gb).

When considering only the GG ratio, it is more preferable that the signal change component ($\Delta Gb_{sig}$) of the green pixel (Gb) be adjusted to be a positive (+) number by increasing the depth of the isolation layer 234 surrounding the green pixel (Gb), but light reception (Rx) efficiency of the green pixel is reduced such that pixel signal characteristics (e.g., sensitivity) of the green pixel can be unexpectedly deteriorated. As a result, reducing the depth of the isolation layer 234 surrounding the green pixel (Gb) may be considered more beneficial in terms of overall pixel signal characteristics.

Figure 8:
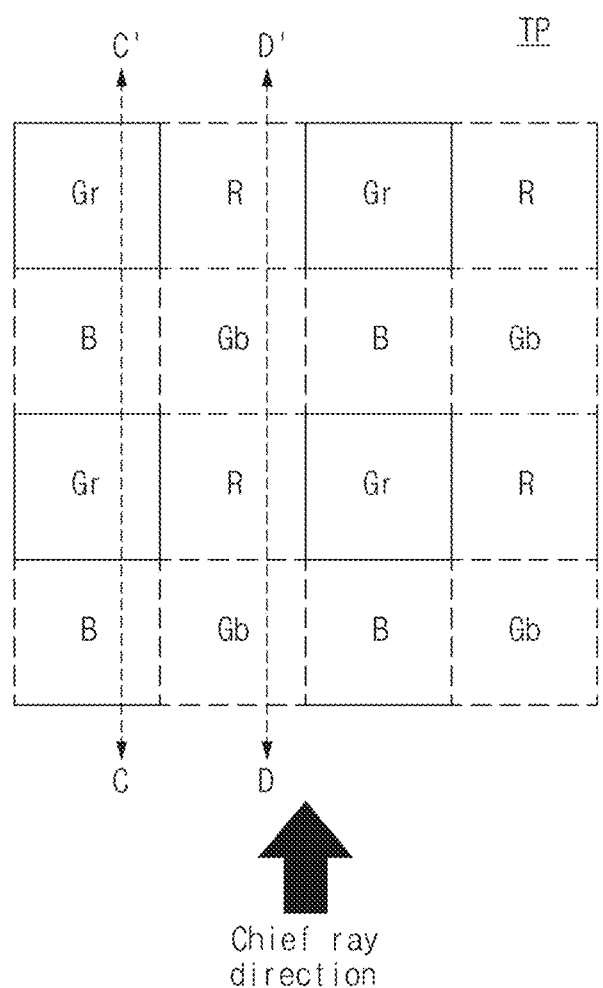
FIG. 8 is a schematic diagram illustrating an example of a top region (TP) shown in FIG. 2 based on some implementations of the disclosed technology.

FIG. 8 is a schematic diagram illustrating an example of the top region (TP) shown in FIG. 2 based on some implementations of the disclosed technology.

In some implementations, the top region (TP) may include a plurality of pixels arranged in a (4×4) matrix structure, and the pixels may be arranged in a Bayer pattern. That is, an arbitrary (2×2) pixel array may include a single red pixel (R), a single blue pixel (B), and two green pixels Gr and Gb. The green pixel (Gr) may be a green pixel adjacent to the red pixel (R) in the row direction, and the green pixel (Gb) is a green pixel adjacent to the blue pixel (B) in the row direction.

As described above, the chief ray at the top region (TP) travels in an upward direction from the center point of the pixel array 110. In this case, the depth of the isolation layer (e.g., 236 of FIG. 10) surrounding the green pixel (Gr) may be a third depth greater than the reference depth. In addition, the depth of the isolation layer (e.g., 238 of FIG. 12) surrounding the green pixel (Gb) may be a fourth depth less than the reference depth.

Although the structures shown in FIGS. 8 to 12 are described centering upon the top region (TP) for convenience of description, in some implementations, the same or similar structures to those of FIGS. 8 to 12 can also be applied to the bottom region (BT).

In FIG. 8, the isolation layer having the third depth is denoted by solid lines, and the isolation layer having the fourth depth is denoted by dotted lines.

Figure 9:
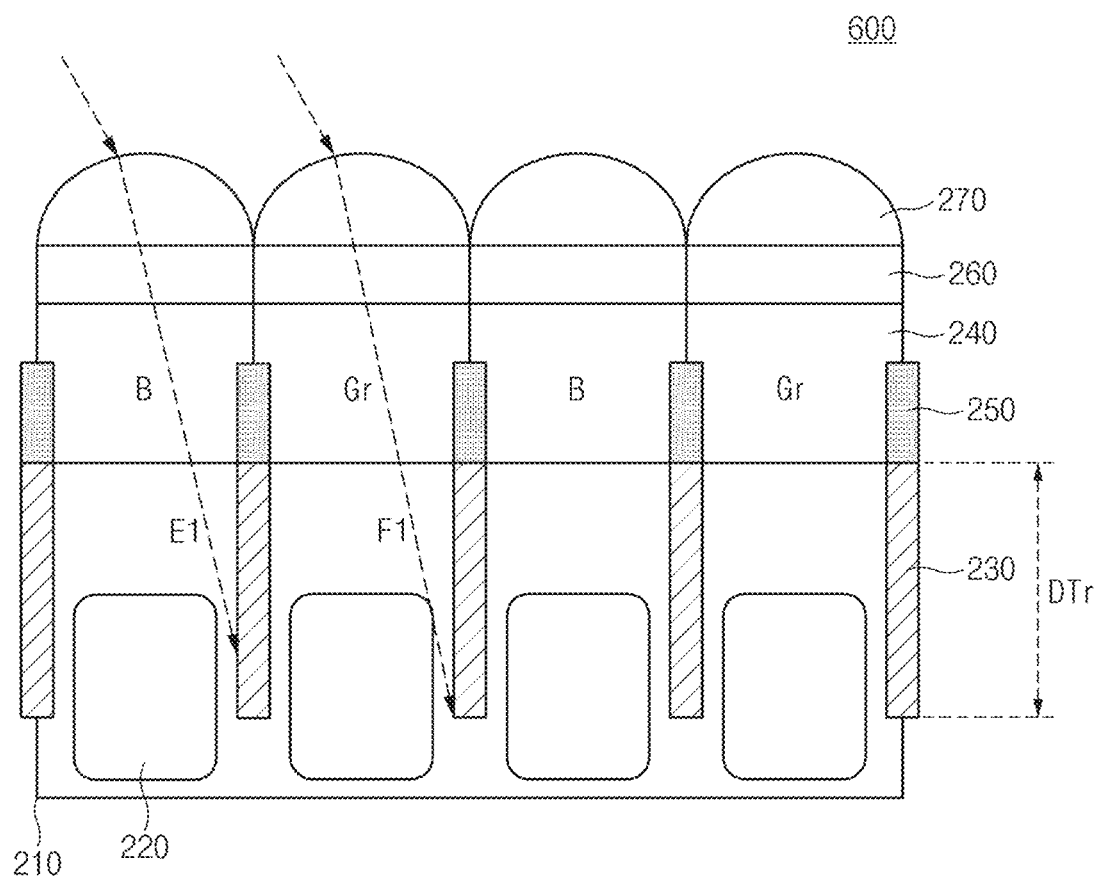
FIG. 9 is a cross-sectional view illustrating a comparison example of the top region (TP) taken along a third cutting line shown in FIG. 8 based on some implementations of the disclosed technology.

FIG. 9 is a cross-sectional view illustrating a comparison example of the top region (TP) taken along a third cutting line C-C' shown in FIG. 8 based on some implementations of the disclosed technology.

In some implementations, assuming that the depth of the isolation layer contained in the top region (TP) shown in FIG. 8 is set to the reference depth (DTr), the cross-sectional view 600 taken along the third cutting line C-C' is shown in FIG. 9.

The cross-sectional view 600 may include a substrate 210, at least one photodiode 220, at least one isolation layer 230, at least one color filter 240, at least one grid 250, at least one over-coating layer 260, and at least one microlens 270.

The remaining components shown in FIG. 9 other than the type of the color filter 240 may be identical or similar to the cross-sectional view 200 shown in FIG. 4.

The depth of the isolation layer 230 may be set to the reference depth (DTr) shown in FIG. 9. The reference depth (DTr) may indicate the depth of the isolation layer 230 that is formed in the center region (CT) in which incident light is directed vertically and not slanted. That is, the reference depth (DTr) may indicate a predetermined depth by which noise resistance characteristics associated with crosstalk, a dark current, or any other unwanted noise of the pixel signal can be optimized in the center region (CT) in which the chief ray is incident in the same or similar direction to the optical axis direction.

Referring to FIG. 9, since the isolation layer 230 having the reference depth (DTr) is spaced apart from the front side of the substrate 210 by a predetermined distance, optical crosstalk may occur between the contiguous pixels in a lower region of the isolation layer 230.

Light leakage (E1) indicates a light beam that has passed through the blue color filter 240 of the blue pixel (B) but has not been absorbed into the photodiode 220 of the blue pixel (B). The light leakage (E1) may pass through the lower portion of the isolation layer 230 and be absorbed into the photodiode 220 of the green pixel (Gr).

In addition, light leakage (F1) indicates a light beam that has passed through the green color filter 240 of the green pixel (Gr) but has not been absorbed into the photodiode 220 of the green pixel (Gr). The light leakage (F1) may pass through the lower portion of the isolation layer 230 and be absorbed into the photodiode 220 of the blue pixel (B).

The light leakage (E1) may be light having a wavelength corresponding to blue light and the light leakage (F1) may be light having a wavelength corresponding to green light.

Therefore, the light leakage (F1) may reach deeper than the light leakage (E1) having the same incident angle as shown in FIG. 9.

Since the chief ray is slanted in an upward direction, each of the light leakages E1 and F1 affecting the green pixel (Gr) may be considered an optical or light component that travels from the blue pixel (B) or to the blue pixel (B).

Figure 10:
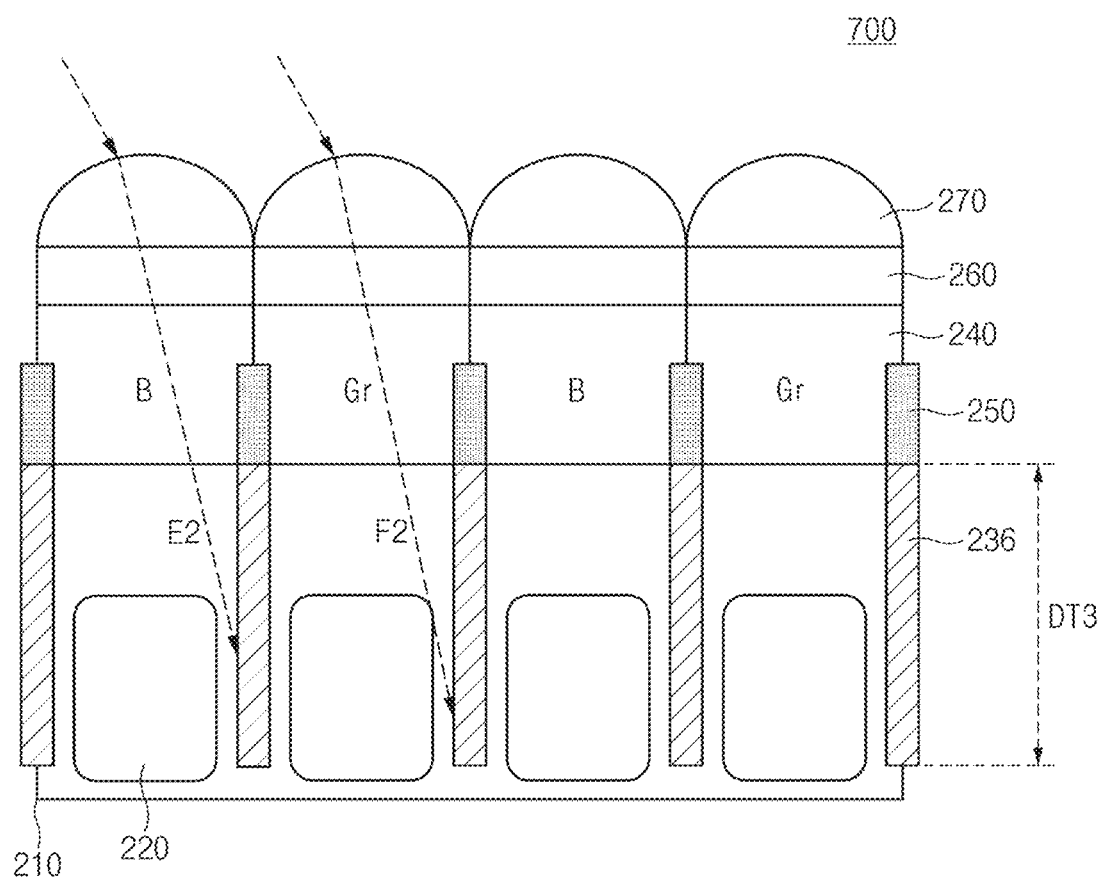
FIG. 10 is a cross-sectional view illustrating one example of the top region (TP) taken along the third cutting line shown in FIG. 8 based on some implementations of the disclosed technology.

FIG. 10 is a cross-sectional view illustrating one example of the top region (TP) taken along the third cutting line C-C' shown in FIG. 8 based on some implementations of the disclosed technology.

Referring to FIGS. 8 and 10, assuming that the depth of the isolation layer surrounding the green pixel (Gr) contained in the top region (TP) shown in FIG. 8 is set to the third depth (DT3), the cross-sectional view 700 taken along the third cutting line C-C' is shown in FIG. 10.

The cross-sectional view 700 may include a substrate 210, at least one photodiode 220, at least one isolation layer 236, at least one color filter 240, at least one grid 250, at least one over-coating layer 260, and at least one microlens 270.

The remaining components shown in FIG. 10 other than the depth of the isolation layer 236 may be identical or similar to the cross-sectional view 600 shown in FIG. 9.

The third depth (DT3) of the isolation layer 236 shown in FIG. 10 may be greater than the reference depth (DTr) of the isolation layer 230 shown in FIG. 9.

As the depth of the isolation layer 236 designed to prevent optical crosstalk gradually increases, light leakage (E2) and light leakage (F2) shown in FIG. 10 may become respectively less than light leakage (E1) and light leakage (F1) shown in FIG. 9. In addition, a reduction of the light leakage (F1) having a wavelength corresponding to green light and capable of reaching deeper than the light leakage (E1) may be larger than a reduction in the light leakage (E1) having a wavelength corresponding to blue light.

Therefore, as can be seen from the cross-sectional view shown in FIG. 10 as compared to the cross-sectional view shown in FIG. 9, a change (or variation) in light leakage affecting the pixel signal of the green pixel (Gr) can be expressed as below:

$$\text{Change in Light Leakage about Green Pixel }(Gr)= (E2-E1)-(F2-F1) \quad \text{(Equation 4)}$$

Since the pixel signal of the green pixel (Gr) is proportional to the intensity of light absorbed into the photodiode 220, the pixel signal of the green pixel (Gr) may have a signal change component corresponding to a light leakage change component about the green pixel (Gr).

Since the reduction (F1−F2) in the light leakage (F1) is larger than the reduction (E1−E2) in the light leakage (E1), each of the change in light leakage about the green pixel (Gr) and the signal change component about the green pixel (Gr) may be denoted by a positive (+) number.

Figure 11:
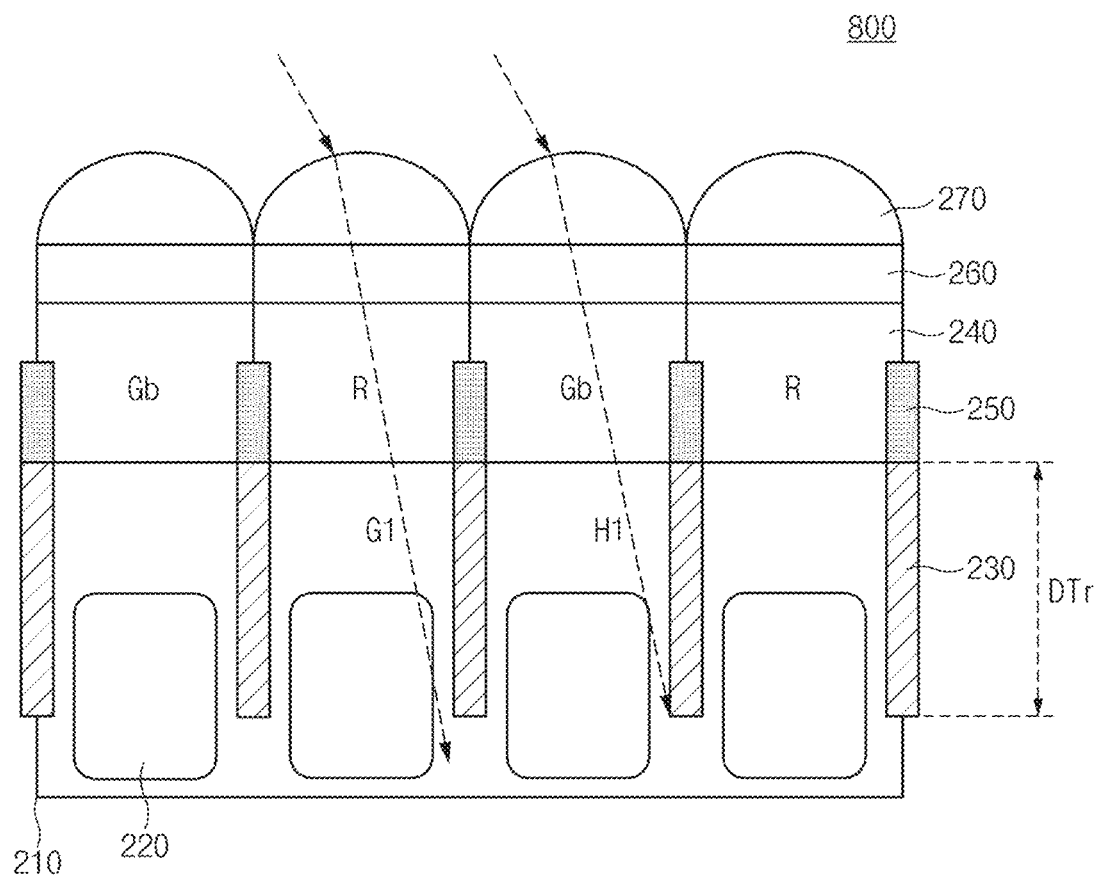
FIG. 11 is a cross-sectional view illustrating a comparison example of the top region (TP) taken along a fourth cutting line shown in FIG. 8 based on some implementations of the disclosed technology.

FIG. 11 is a cross-sectional view illustrating a comparison example of the top region (TP) taken along a fourth cutting line D-D' shown in FIG. 8 based on some implementations of the disclosed technology.

Referring to FIGS. 8 and 11, assuming that the depth of the isolation layer contained in the top region (TP) shown in FIG. 8 is set to the reference depth (DTr), the cross-sectional view 800 taken along the fourth cutting line D-D' is shown in FIG. 11.

The cross-sectional view 800 may include a substrate 210, at least one photodiode 220, at least one isolation layer 230, at least one color filter 240, at least one grid 250, at least one over-coating layer 260, and at least one microlens 270.

The remaining components shown in FIG. 11 other than the type of the color filter 240 are substantially identical in structure and material to the cross-sectional view 200 shown in FIG. 4, and as such redundant matters will herein be omitted for brevity.

Referring to FIG. 11, since the isolation layer 230 having the reference depth (DTr) is spaced apart from the front side of the substrate 210 by a predetermined distance, optical crosstalk may occur between the contiguous pixels in a lower region of the isolation layer 230.

That is, light leakage (G1) indicates a light beam that has passed through the red color filter 240 of the red pixel (R) but has not been absorbed into the photodiode 220 of the red pixel (R). The light leakage (G1) may pass through the lower portion of the isolation layer 230 and be absorbed into the photodiode 220 of the green pixel (Gb).

In addition, light leakage (H1) indicates a light beam that has passed through the green color filter 240 of the green pixel (Gb) but has not been absorbed into the photodiode 220 of the green pixel (Gb). The light leakage (H1) may pass through the lower portion of the isolation layer 230 and be absorbed into the photodiode 220 of the red pixel (R).

The light leakage (G1) may be light having a wavelength corresponding to red light and the light leakage (H1) may be light having a wavelength corresponding to green light. Therefore, the light leakage (G1) may reach deeper than the light leakage (H1) having the same incident angle as shown in FIG. 11.

Since the chief ray is slanted in an upward direction, each of the light leakages G1 and H1 affecting the green pixel (Gb) may be considered an optical or light component that travels from the red pixel (R) or to the red pixel (R).

Figure 12:
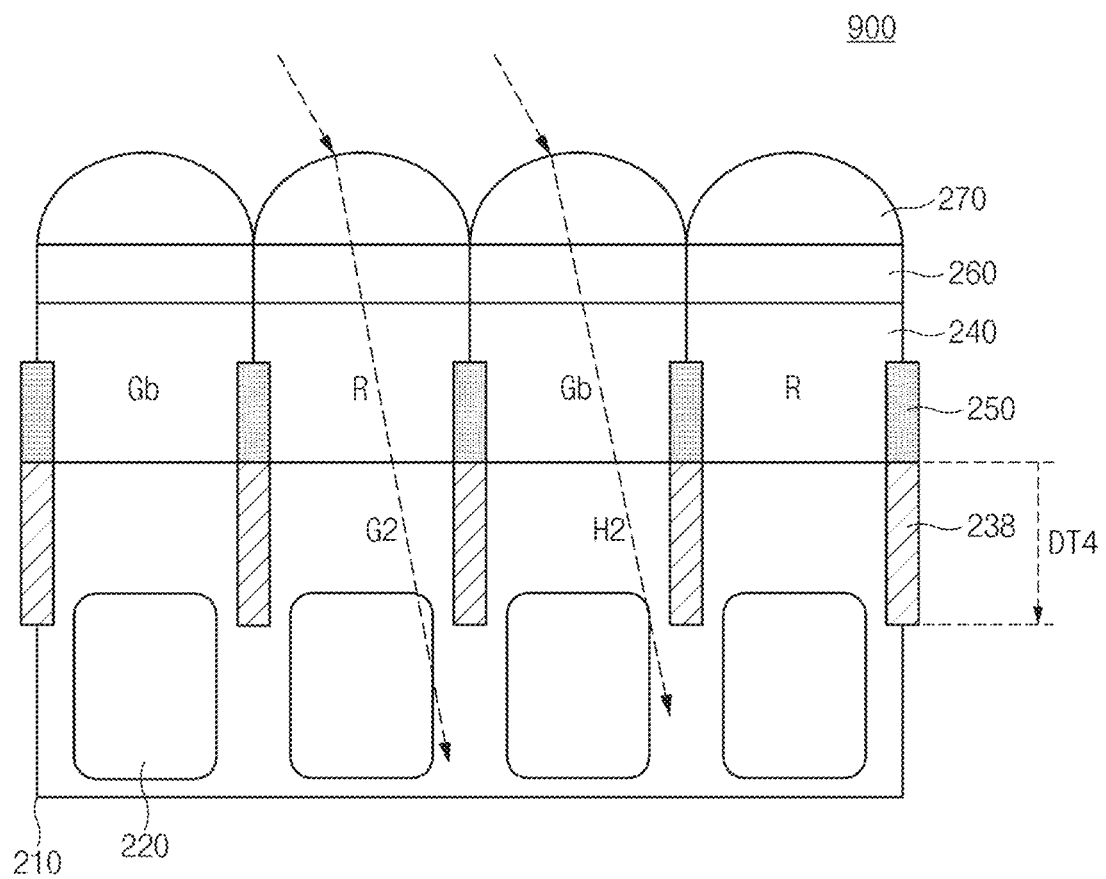
FIG. 12 is a cross-sectional view illustrating one example of the top region (TP) taken along the fourth cutting line shown in FIG. 8 based on some implementations of the disclosed technology.

FIG. 12 is a cross-sectional view illustrating one example of the top region (TP) taken along the fourth cutting line D-D' shown in FIG. 8 based on some implementations of the disclosed technology.

Referring to FIGS. 9, 11 and 12, assuming that the depth of the isolation layer surrounding the green pixel (Gb) contained in the top region (TP) shown in FIG. 8 is set to the fourth depth (DT4), the cross-sectional view 900 taken along the fourth cutting line D-D' is shown in FIG. 12.

The cross-sectional view 900 may include a substrate 210, at least one photodiode 220, at least one isolation layer 238, at least one color filter 240, at least one grid 250, at least one over-coating layer 260, and at least one microlens 270.

The remaining components shown in FIG. 12 other than the depth of the isolation layer 238 and the type of the color filter 240 may be identical or similar to the cross-sectional view 200 shown in FIG. 4.

The fourth depth (DT4) of the isolation layer 238 shown in FIG. 12 may be smaller than the reference depth (DTr) of the isolation layer 230 shown in FIG. 11.

As the depth of the isolation layer 238 designed to prevent optical crosstalk gradually decreases, light leakage (G2) and light leakage (H2) shown in FIG. 12 may become respectively larger than light leakage (G1) and light leakage (H1) shown in FIG. 11. In addition, an increase in the light leakage (G2) having a wavelength corresponding to red light and capable of reaching deeper than the light leakage (H2) may be larger than an increase in the light leakage (H2) having a wavelength corresponding to green light.

Therefore, as can be seen from the cross-sectional view shown in FIG. 12 as compared to the cross-sectional view shown in FIG. 11, a change (or variation) in light leakage affecting the pixel signal of the green pixel (Gb) can be expressed as below:

Change in Light Leakage about Green Pixel (Gb)= (G2−G1)−(H2−H1)  (Equation 5)

Since the pixel signal of the green pixel (Gb) is proportional to the intensity of light absorbed into the photodiode 220, the pixel signal of the green pixel (Gb) may have a signal change component corresponding to a light leakage change component about the green pixel (Gb).

Since the increase (G2−G1) of the light leakage (G1) is larger than the increase (H2−F1) of the light leakage (H1), each of the change in light leakage about the green pixel (Gb) and the signal change component about the green pixel (Gb) may be denoted by a positive (+) number.

Referring to FIGS. 10 and 12, in the top region (TP) of the pixel array 110, the signal change component of the green pixel (Gr) may be adjusted to be a positive (+) number by increasing the depth of the isolation layer 236 surrounding the green pixel (Gr), and the signal change component of the green pixel (Gb) may also be adjusted to be a positive (+) number by reducing the depth of the isolation layer 238 surrounding the green pixel (Gb).

In each of the top region (TP) and the bottom region (BT) of the pixel array 110, light transferred from the red pixel (R) to the green pixel (Gb) may have higher intensity (or higher priority), such that the GG ratio is generally denoted by a negative (−) number.

If a deviation (or difference) between the GG ratio and the ideal value is considered high, the depth of the isolation layer 236 surrounding the green pixel (Gr) increases such that the signal change component ($\Delta Gr_{sig}$) of the green pixel (Gr) is adjusted to be a positive (+) number. In addition, the depth of the isolation layer 238 surrounding the green pixel (Gb) decreases such that the signal change component ($\Delta Gb_{sig}$) of the green pixel (Gb) is adjusted to be a positive (+) number. Here, the absolute value of the signal change component ($\Delta Gr_{sig}$) of the green pixel (Gr) may be adjusted to be higher than the absolute value of the signal change component ($\Delta Gb_{sig}$) of the green pixel (Gb). For example, the absolute value of the signal change component ($\Delta Gr_{sig}$) of the green pixel (Gr) may be associated with a difference between the third depth (DT3) and the reference depth (DTr), and the absolute value of the signal change component ($\Delta Gb_{sig}$) of the green pixel (Gb) may be associated with a difference between the fourth depth (DT4) and the reference depth (DTr), such that the third depth (DT3) and the fourth depth (DT4) can be experimentally determined in a manner that the absolute value of the signal change component ($\Delta Gr_{sig}$) of the green pixel (Gr) is higher than the absolute value of the signal change component ($\Delta Gb_{sig}$) of the green pixel (Gb).

When considering only the GG ratio, it is more preferable that the signal change component ($\Delta Gb_{sig}$) of the green pixel (Gb) be adjusted to be a negative (−) number by increasing the depth of the isolation layer 238 surrounding the green pixel (Gb), but light reception (Rx) efficiency of the green pixel is reduced such that pixel signal characteristics (e.g., sensitivity) of the green pixel can be unexpectedly deteriorated. As a result, reducing the depth of the isolation layer 238 surrounding the green pixel (Gb) may be considered more beneficial in terms of overall pixel signal characteristics.

Figure 13:
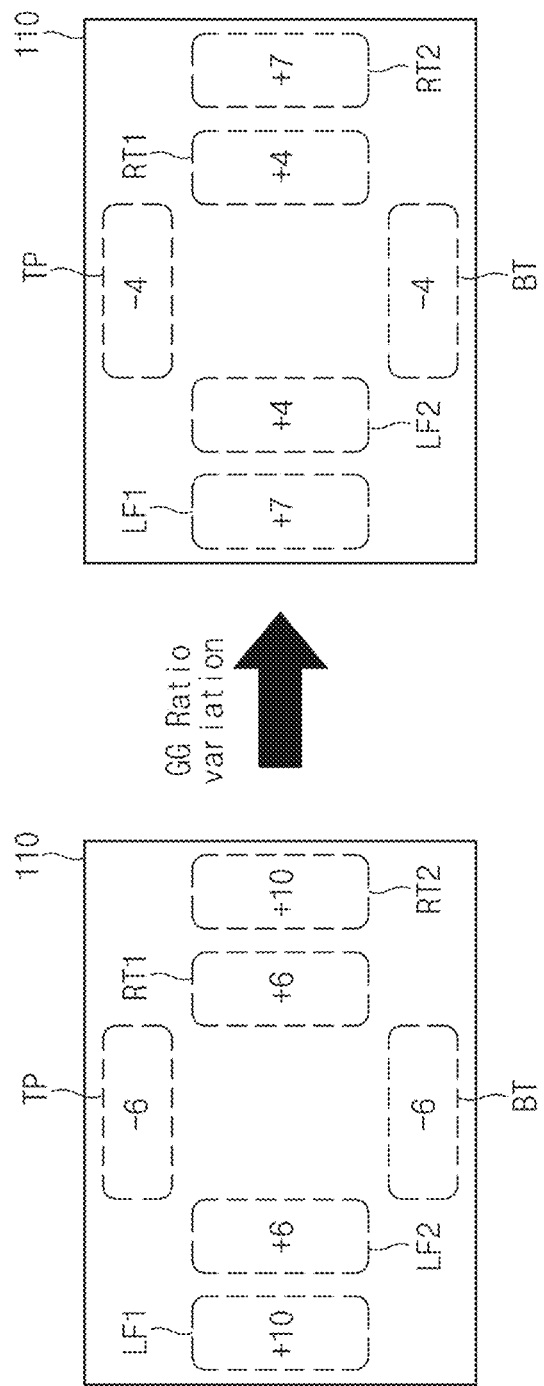
FIG. 13 is a conceptual diagram illustrating a method for improving the GG ratio based on some implementations of the disclosed technology.

FIG. 13 is a conceptual diagram illustrating a method for improving the GG ratio based on some implementations of the disclosed technology.

The left drawing of FIG. 13 may illustrate the GG ratio values of the respective regions in a situation in which the isolation layers contained in the pixel array 110 have the same reference depth (DTr).

Referring to FIG. 13, if the number of columns contained in the pixel array 110 is more than the number of rows contained in the pixel array 110, the left region (LF) may be divided into a first left region (LF1) and a second left region (LF2), and the right region (RT) may be divided into a first right region (RT1) and a second right region (RT2).

As described above, each of the GG ratio of the top region (TP) and the GG ratio of the bottom region (BT) may be denoted by "−6" corresponding to a negative (−) number according to arrangement characteristics of the Bayer pattern and the chief ray direction. In addition, the GG ratio of the first left region (LF1) and the GG ratio of the second left region (LF2) may be respectively denoted by "+10" and "+6", the GG ratio of the first right region (RT1) and the GG ratio of the second right region (RT2) may be respectively denoted by "+6" and "+10". The absolute value of the GG ratio may gradually increase in the order from +6 to +10 in inverse proportion to the distance to the edge region of the pixel array 110.

The right drawing of FIG. 13 may illustrate the GG ratio values of the respective regions in a situation in which the depth of each isolation layer contained in the pixel array 110 has already been adjusted.

In each of the left and right regions (LF1, LF2, RT1, RT2), the depth of the isolation layer 232 surrounding the green pixel (Gr) may increase to adjust the signal change component ($\Delta Gr_{sig}$) of the green pixel (Gr) to be a negative (−) number, and the depth of the isolation layer 234 surrounding the green pixel (Gb) may decrease to adjust the signal change component ($\Delta Gb_{sig}$) of the green pixel (Gb) to be a negative (−) number, such that the absolute value of the signal change component ($\Delta Gr_{sig}$) of the green pixel (Gr) can be adjusted to be higher than the absolute value of the signal change component ($\Delta Gb_{sig}$) of the green pixel (Gb). In this case, the depth of the isolation layer surrounding the green pixel (Gr) and the depth of the isolation layer surrounding the green pixel (Gb) in each of the left and right regions LF1 and RT2 relatively close to the edge of the pixel array 110 may be different from the depth of the isolation layer surrounding the green pixel (Gr) and the depth of the isolation layer surrounding the green pixel (Gb) in each of the left and right regions LF2 and RT1 relatively far from the edge of the pixel array 110. This is because the absolute value of the GG ratio in each of the left and right regions LF1 and RT2 relatively close to the edge of the pixel array 110 is higher than the absolute value of the GG ratio in each of the remaining left and right regions LF2 and RT1, such that the change of the GG ratio in each of the left and right regions LF1 and RT2 should be adjusted to be a higher value. For example, the depth of each isolation layer located in a peripheral region of the green pixel (Gr) and the green pixel (Gb) in each of the left and right regions LF1 and RT2 may be greater than the depth of each isolation layer located in a peripheral region of the green pixel (Gr) and the green pixel (Gb) in each of the left and right regions LF2 and RT1.

Although FIG. 13 has exemplarily disclosed that each of the left and right regions is divided into two regions in a manner that the GG ratio can be improved for convenience of description, it should be noted that each of the left and right regions can also be divided into three or more regions in a manner that the GG ratio can be improved as necessary. In addition, each of the top and bottom regions can also be divided into a plurality of regions, such that the GG ratio can also be improved stepwise.

As can be seen from FIG. 13, it can be recognized that the GG ratio of the first left region (LF1) is reduced by "3" and the GG ratio of the second right region (RT2) is reduced by "3", and it can also be recognized that the GG ratio of the second left region (LF2) is reduced by "2" and the GG ratio of the first right region (RT1) is reduced by "2".

Likewise, in each of the top region (TP) and the bottom region (BT), the signal change component ($\Delta Gr_{sig}$) of the green pixel (Gr) may be adjusted to be a positive (+) number by increasing the depth of the isolation layer 236 surrounding the green pixel (Gr), and the signal change component ($\Delta Gb_{sig}$) of the green pixel (Gb) may also be adjusted to be a positive (+) number by reducing the depth of the isolation layer 238 surrounding the green pixel (Gb). In this case, the absolute value of the signal change component ($\Delta Gr_{sig}$) of the green pixel (Gr) may be adjusted to be higher than the absolute value of the signal change component ($\Delta Gb_{sig}$) of the green pixel (Gb).

As can be seen from FIG. 13, it can be recognized that the GG ratio of the top region (TP) is increased by "2" and the GG ratio of the bottom region (BT) is increased by "2".

In light of the above description, the image sensor according to the embodiments of the disclosed technology can be implemented in ways that reduce the amount of noise generable by green pixels arranged in regions located close to the edge regions of the pixel array, thus achieving improved imaging performance. The embodiments of the disclosed technology may provide a variety of effects.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. An image sensor comprising:
   a first pixel of a first color arranged alternately with a pixel of a second color in a first direction of a pixel array;
   a second pixel of the first color arranged alternately with a pixel of a third color in the first direction in a row different from that of the first pixel of the first color;
   a first isolation layer formed to surround the first pixel in the pixel array and structured to have a first depth; and
   a second isolation layer formed to surround the second pixel in the pixel array and structured to have a second depth different from the first depth, wherein one of the first and second pixels of the first color, and each of the pixels of the second color and the third color are configured to selectively receive different colors of light, respectively, wherein each of the first and second pixels of the first color, the pixel of the second color, and the pixel of the third color includes:

a substrate;

a color filter disposed over the substrate, and configured to allow light corresponding to one of a red color, a blue color, and a green color to selectively pass therethrough; and a photodiode disposed below the color filter and in the substrate, and wherein each of the first isolation layer and the second isolation layer is a backside deep trench isolation (BDTI) layer that is recessed in a vertical direction by a predetermined depth from a back side of the substrate.

2. The image sensor according to claim 1, wherein the first depth is greater than the second depth.

3. The image sensor according to claim 1, wherein the first color is green, and the second and third colors are red and blue, respectively.

4. The image sensor according to claim 3, wherein the first pixel of the first color, the second pixel of the first color, the pixel of the second color, and the pixel of the third color constitute a Bayer pattern.

5. The image sensor according to claim 1, wherein the pixel array includes a top region, a bottom region, a left region, and a right region that are respectively arranged in a top side, a bottom side, a left side, and a right side with respect to a center region of the pixel array.

6. The image sensor according to claim 5, wherein:

the first isolation layer surrounding the first pixel of the first color in the center region and the second isolation layer surrounding the second pixel of the first color in the center region are configured to have a reference depth.

7. The image sensor according to claim 6, wherein the first depth is greater than the reference depth.

8. The image sensor according to claim 6, wherein the second depth is less than the reference depth.

9. The image sensor according to claim 1, wherein each of the first isolation layer and the second isolation layer includes:

an inner layer includes a conductive material configured to receive a bias voltage; and a sidewall configured to surround the inner layer.

10. The image sensor according to claim 1, wherein the first direction is a row direction.

11. An image sensor comprising:

a first pixel of a first color arranged alternately with a pixel of a second color in a first direction of a pixel array;

a second pixel of the first color arranged alternately with a pixel of a third color in the first direction in a row different from that of the first pixel of the first color;

a first isolation layer formed to surround the first pixel in the pixel array and structured to have a first depth; and a second isolation layer formed to surround the second pixel in the pixel array and structured to have a second depth different from the first depth, wherein one of the first and second pixels of the first color, and each of the pixels of the second color and the third color are configured to selectively receive different colors of light, respectively, wherein the pixel array includes a top region, a bottom region, a left region, and a right region that are respectively arranged in a top side, a bottom side, a left side, and a right side with respect to a center region of the pixel array, and wherein:

at least one of the top region, the bottom region, the left region, and the right region is divided into a plurality of regions; and the first isolation layer surrounding the first pixel of the first color in one region among the plurality of regions and the first isolation layer surrounding the first pixel of the first color in another region are configured to have different depths.

12. The image sensor according to claim 11, wherein:

at least one of the top region, the bottom region, the left region, and the right region is divided into a plurality of regions; and the second isolation layer surrounding the second pixel of the first color in one region among the plurality of regions and the second isolation layer surrounding the second pixel of the first color in another region are configured to have different depths.

13. An image sensor comprising:

a color filter array including a red color filter, a blue color filter, a green color filter that are arranged in a Bayer pattern; and a substrate in which an isolation layer is formed to surround each of the red color filter, the blue color filter, and the green color filter, wherein the isolation layer includes a first isolation layer surrounding a green color filter adjacent in a first direction to a red color filter contained in the color filter array and a second isolation layer surrounding a green color filter adjacent in the first direction to a blue color filter contained in the color filter array, wherein:

the first isolation layer has a first depth; and the second isolation layer has a second depth different from the first depth.

14. The image sensor according to claim 13, wherein the first depth is greater than the second depth.

15. The image sensor according to claim 13, wherein the color filter array includes a top region, a bottom region, a left region, and a right region that are respectively arranged in a top side, a bottom side, a left side, and a right side with respect to a center region of the color filter array.

16. The image sensor according to claim 15, wherein:

the first isolation layer surrounding a green color filter adjacent in the first direction to a red color filter contained in the center region and the second isolation layer surrounding a green color filter adjacent in the first direction to a blue color filter contained in the center region are configured to have a reference depth.

17. The image sensor according to claim 16, wherein the first depth is greater than the reference depth.

18. The image sensor according to claim 16, wherein the second depth is less than the reference depth.

* * * * *